US010620526B2

(12) United States Patent
Zhang et al.

(10) Patent No.: US 10,620,526 B2
(45) Date of Patent: Apr. 14, 2020

(54) MASK, MANUFACTURING METHOD THEREOF, PATTERNING METHOD EMPLOYING MASK, OPTICAL FILTER

(71) Applicants: BOE TECHNOLOGY GROUP CO., LTD., Beijing (CN); BEIJING BOE DISPLAY TECHNOLOGY CO., LTD., Beijing (CN)

(72) Inventors: Zhichao Zhang, Beijing (CN); Tsung Chieh Kuo, Beijing (CN); Zheng Liu, Beijing (CN); Shoukun Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 370 days.

(21) Appl. No.: 15/326,566

(22) PCT Filed: Jul. 8, 2016

(86) PCT No.: PCT/CN2016/089402
§ 371 (c)(1),
(2) Date: Jan. 16, 2017

(87) PCT Pub. No.: WO2017/067239
PCT Pub. Date: Apr. 27, 2017

(65) Prior Publication Data
US 2017/0269467 A1   Sep. 21, 2017

(30) Foreign Application Priority Data

Oct. 19, 2015   (CN) .......................... 2015 1 0680818

(51) Int. Cl.
*G03F 1/50*   (2012.01)
*G03F 1/22*   (2012.01)
(Continued)

(52) U.S. Cl.
CPC ............... *G03F 1/22* (2013.01); *G02B 5/201* (2013.01); *G02B 5/208* (2013.01);
(Continued)

(58) Field of Classification Search
CPC . G03F 1/50; G03F 1/54; G03F 7/0007; G02B 5/201; G02B 5/208; G02B 5/223; G02F 1/133514; G02F 1/133516
(Continued)

(56) References Cited

U.S. PATENT DOCUMENTS 5,739,898 A   4/1998 Ozawa et al.
5,858,581 A   1/1999 Stephenson
(Continued)

FOREIGN PATENT DOCUMENTS

CN   101060110 A   10/2007
CN   101770050 A   7/2010
(Continued)

OTHER PUBLICATIONS

International Search Report and Written Opinion dated Sep. 21, 2016; PCT/CN2016/089402.
(Continued)

*Primary Examiner* — John A McPherson
(74) *Attorney, Agent, or Firm* — Ladas & Parry LLP

(57) ABSTRACT

A mask, a manufacturing method thereof, and a patterning method employing the mask. In the mask, a plurality of masks can be combined into one mask. The pattern area (01) of the mask is provided with a first pattern section (10) and a second pattern section (20) which are not overlapped with each other; light of a first wavelength can run through the first pattern section (10) but light of a second wavelength cannot run through the first pattern section; the light of the second wavelength can run thorough the second pattern section (20) but the light of the first wavelength cannot run
(Continued)

through the second pattern section; and the light of the first wavelength and the light of the second wavelength can run through the non-pattern area, or any of the light of the first wavelength and the light of the second wavelength cannot run through the non-pattern area. The mask is obtained by combining a plurality of masks.

18 Claims, 8 Drawing Sheets

(51) Int. Cl.
    *G03F 7/20*     (2006.01)
    *G03F 7/00*     (2006.01)
    *G03F 1/54*     (2012.01)
    *G03F 1/58*     (2012.01)
    *G02B 5/20*     (2006.01)
    *G02F 1/1343*     (2006.01)
    *G03F 1/38*     (2012.01)
    *G03F 1/76*     (2012.01)
    *G03F 7/038*     (2006.01)
    *G03F 7/039*     (2006.01)
    *G03F 7/095*     (2006.01)
    *G03F 7/16*     (2006.01)
    *G03F 7/26*     (2006.01)
    *G02F 1/1362*     (2006.01)

(52) U.S. Cl.
    CPC ............ *G02F 1/13439* (2013.01); *G03F 1/38* (2013.01); *G03F 1/50* (2013.01); *G03F 1/54* (2013.01); *G03F 1/58* (2013.01); *G03F 1/76* (2013.01); *G03F 7/0007* (2013.01); *G03F 7/0035* (2013.01); *G03F 7/038* (2013.01); *G03F 7/039* (2013.01); *G03F 7/095* (2013.01); *G03F 7/16* (2013.01); *G03F 7/2004* (2013.01); *G03F 7/2022* (2013.01); *G03F 7/26* (2013.01); *G03F 7/70283* (2013.01); *G03F 7/70466* (2013.01); *G03F 7/70575* (2013.01); *G02F 2001/13625* (2013.01)

(58) Field of Classification Search
    USPC .......................................... 430/5, 7; 349/106
    See application file for complete search history.

(56) References Cited

U.S. PATENT DOCUMENTS

| | | | |
|---|---|---|---|
| 8,278,760 B2 | 10/2012 | Matsubara | |
| 2006/0068299 A1* | 3/2006 | Barber | ...................... G03F 1/50 430/5 |
| 2006/0138083 A1* | 6/2006 | Ryan | ........................ B82Y 5/00 216/62 |
| 2007/0134565 A1 | 6/2007 | Kang | |
| 2007/0241329 A1 | 10/2007 | Matsubara | |
| 2009/0130486 A1 | 5/2009 | Zhou et al. | |
| 2009/0270007 A1* | 10/2009 | Seok | ...................... G02F 1/1339 445/25 |
| 2010/0308439 A1 | 12/2010 | Lee et al. | |
| 2012/0308919 A1* | 12/2012 | Chen | ...................... G02B 5/201 430/5 |
| 2015/0226891 A1 | 8/2015 | Song | |
| 2015/0316843 A1* | 11/2015 | Xu | .......................... G02B 5/223 359/885 |

FOREIGN PATENT DOCUMENTS

| | | |
|---|---|---|
| CN | 101908470 A | 12/2010 |
| CN | 102213785 A | 10/2011 |
| CN | 103984052 A | 8/2014 |
| CN | 104166303 A | 11/2014 |
| CN | 105182679 A | 12/2015 |
| JP | 2000-075122 A | 3/2000 |

OTHER PUBLICATIONS

The First Chinese Office Action dated Jan. 11, 2019; Appln. No. 201510680818.7.
Extended European Search Report dated Apr. 26, 2019; Appln. No. 16805263.7.
The Second Chinese Office Action dated Aug. 23, 2019; Appln. No. 201510680818.7.

* cited by examiner

MASK, MANUFACTURING METHOD THEREOF, PATTERNING METHOD EMPLOYING MASK, OPTICAL FILTER

TECHNICAL FIELD

At least one embodiment of the present disclosure relates to a mask, a manufacturing method thereof, a patterning method employing the mask, and an optical filter.

BACKGROUND

Thin-film transistor liquid crystal displays (TFT-LCDs) have become mainstream products in the display field. The basic structure of a TFT-LCD includes an array substrate and an opposing substrate which are arranged opposite to each other, and a liquid crystal layer disposed between them. Generally, thin-film transistors (TFTs) arranged in a matrix are disposed on the array substrate, and a color filter (CF) layer is disposed on the opposing substrate. In this case, the opposing substrate is also referred to as a CF substrate.

In the manufacturing process of the array substrate and the CF substrate of the TFT-LCD, masks are needed in patterning processes. For instance, in the process of manufacturing the array substrate, one mask is required for forming a gate metal layer (e.g., including gate lines and gate electrodes), and another mask is required for forming a transparent electrode layer (e.g., including pixel electrodes). For instance, masks are required for forming the CF layer on the CF substrate.

For instance, the patterning method employing a mask may comprise the following steps: coating photoresist on a film; aligning the mask and the film; irradiating the mask with a light source, whereby the photoresist on the film can sense light passing through the mask; and subsequently, forming a required pattern of the film after developing and etching.

Photoresist includes negative photoresist and positive photoresist. Photoresist converted into an insoluble material after light irradiation is referred to as negative photoresist. In contrast, photoresist which is insoluble in some solvent but converted into a soluble material after light irradiation is referred to as positive photoresist.

In general, a mask is manufactured by forming pattern areas on a substrate such as plastics or glass, so the mask includes a pattern area and a non-pattern area. As for negative photoresist, light emitted by a light source can run through the pattern area of the mask and the light cannot run through the non-pattern area of the mask, so the portion of the negative photoresist corresponding to the pattern area of the mask is exposed and retained in the development process, and the portion of the photoresist corresponding to the non-pattern area is not exposed and removed in the development process. Similarly, as for positive photoresist, the light emitted by the light source cannot run through the pattern area of the mask and the light can run through the non-pattern area of the mask, so the portion of the photoresist corresponding to the pattern area of the mask is not exposed and retained in the development process, and the portion of the photoresist corresponding to the non-pattern area is exposed and removed in the development process.

SUMMARY

At least one embodiment of the present disclosure provides a mask, a manufacturing method thereof, a patterning method employing the mask, and an optical filter, in which a plurality of masks are combined into one mask.

At least one embodiment of the present disclosure provides a mask, comprising a pattern area and a non-pattern area; the pattern area is provided with a first pattern section and a second pattern section which are not overlapped with each other; light of a first wavelength can run through the first pattern section but light of a second wavelength cannot run through the first pattern section; the light of the second wavelength can run thorough the second pattern section but the light of the first wavelength cannot run through the second pattern section; and the light of the first wavelength and the light of the second wavelength can run through the non-pattern area, or any of the light of the first wavelength and the light of the second wavelength cannot run through the non-pattern area.

At least one embodiment of the present disclosure provides a method for manufacturing a mask, comprising: forming a pattern area on a base substrate, in which the pattern area is provided with a first pattern section and a second pattern section which are not overlapped with each other; light of a first wavelength can run through the first pattern section but light of a second wavelength cannot run through the first pattern section; the light of the second wavelength can run through the second pattern section but the light of the first wavelength cannot run through the second pattern section; and taking a portion of the base substrate, disposed on outside of an orthographic projection of the pattern area on the base substrate, as a non-pattern area, in which the light of the first wavelength and the light of the second wavelength can run through the non-pattern area; or forming the non-pattern area on a portion of the base substrate, disposed on outside of the orthographic projection of the pattern area on the base substrate, in which any of the light of the first wavelength and the light of the second wavelength cannot run through the non-pattern area.

At least one embodiment of the present disclosure provides a patterning method employing the above mask, in the case where the light of the first wavelength and the light of the second wavelength can run through the non-pattern area of the mask, the method comprising: sequentially forming a first film and first positive photoresist on the first film; irradiating the first positive photoresist via the mask with the light of the second wavelength; forming a first film pattern after first development and first etching; sequentially forming a second film and second positive photoresist on the second film on the first film pattern; irradiating the second positive photoresist via the mask with the light of the first wavelength; and forming a second film pattern after second development and second etching; alternatively, in the case where any of the light of the first wavelength and the light of the second wavelength cannot run through the non-pattern area of the mask, the method comprising: sequentially forming a first film and first negative photoresist on the first film; irradiating the first negative photoresist via the mask with the light of the first wavelength; forming a first film pattern after first development and first etching; sequentially forming a second film and second negative photoresist on the second film on the first film pattern; irradiating the second negative photoresist via the mask with the light of the second wavelength; and forming a second film pattern after second development and second etching.

At least one embodiment of the present disclosure provides an optical filter, comprising a plurality of first filter patterns and a plurality of second filter patterns; the plurality of first filter patterns and the plurality of second filter patterns are arranged into a plurality of filter pattern rows and a plurality of filter pattern columns; in each filter pattern row and each filter pattern column, one second filter pattern is disposed between adjacent first filter patterns, and one first filter pattern is disposed between adjacent second filter patterns; light of a first wavelength can run through each first filter pattern; light of a second wavelength can run through each second filter pattern; and the first wavelength is different from the second wavelength.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 9b is a schematic sectional view along a line BB in FIG. 9a; and

DETAILED DESCRIPTION

Figure 1A:
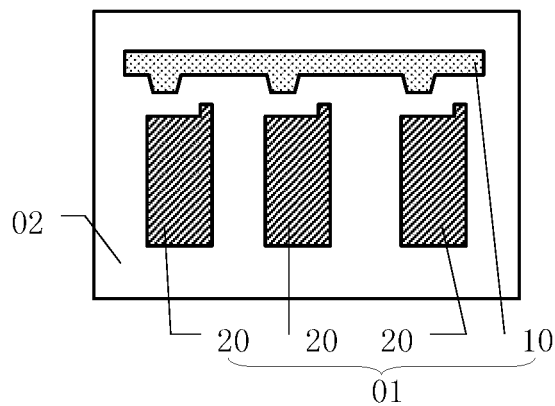
FIG. 1a is a schematic partial top view of a mask provided by a first embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Currently, the masks are expensive, with the prices from tens of thousands to hundreds of thousands of dollars, and have become one kind of main costs in the development process of TFF-LCD products.

An embodiment of the present disclosure provides a mask, a manufacturing method thereof, and a patterning method employing the mask. A plurality of optical filter materials is provided on the mask; each optical filter material corresponds to a pattern; and the patterns corresponding to the plurality of optical filter materials are not overlapped with each other. In this way, a plurality of masks can be combined into one mask. In the process of patterning a film via the mask, light of a preset wavelength is adopted to irradiate the mask and positive or negative photoresist comparable with the light of the preset wavelength is adopted; the required pattern on the mask can be transferred to the photoresist after development; and the required pattern can be obtained after the etching of the film by utilization of the photoresist pattern. As the mask is provided with a plurality of patterns, which are not overlapped with each other and formed of the plurality of optical filter materials, a plurality of films can be patterned via the same mask. Thus, at least one mask can be reduced in the process of manufacturing an array substrate or a CF substrate, so that the costs can be greatly reduced. Of course, the mask provided by the embodiment of the present disclosure may also be used for manufacturing other required patterns and not limited to the case of being used for manufacturing an array substrate or a CF substrate.

First Embodiment

The embodiment provides a mask and a patterning method employing the mask. The mask provided by the embodiment includes two pattern sections which are not overlapped with each other. Moreover, light of different wavelengths can respectively run through the two pattern sections. Thus, two films can be respectively patterned via the mask to form two film patterns, so that one mask can be saved.

The mask provided by the embodiment, as shown in FIG. 1a, comprises a pattern area 01 and a non-pattern area 02. The pattern area 01 is provided with a first pattern section 10 and a second pattern section 20 which are not overlapped with each other; light of a first wavelength $\lambda 1$ can run through the first pattern section 10 but light of a second wavelength λ2 cannot run through the first pattern section 10; the light of the second wavelength λ2 can run through the second pattern section 20 but the light of the first wavelength λ1 cannot run through the second pattern section 20; and the light of the first wavelength λ1 and the light of the second wavelength λ2 can run through the non-pattern area 02, or any of the light of the first wavelength λ1 and the light of the second wavelength λ2 cannot run through the non-pattern area 02.

At present, commonly used photoresist includes ultraviolet (UV) photoresist, e.g., photoresist for G ray (436 nm), H ray (405 nm), I ray (365 nm), 248 nm, 193 nm and 13.4 nm. Correspondingly, in the embodiment, both the light of the first wavelength λ1 and the light of the second wavelength λ2 may be UV light so as to be comparable with the UV photoresist. Of course, the light of the first wavelength and the light of the second wavelength may also be light of other wavelengths comparable with the applied photoresist. In addition, both the first wavelength λ1 and the second wavelength λ2 may be a single wavelength or a wavelength range. For instance, the first wavelength λ1 may be 10 nm-450 nm; the second wavelength λ2 may be 10 nm-450 nm; and the first wavelength λ1 and the second wavelength λ2 are different from or not overlapped with each other. Of course, the embodiment includes but not limited thereto. For instance, when the photoresist is non-UV photoresist, the light of the first wavelength and the light of the second wavelength each is correspondingly non-UV light.

In the embodiment, by respectively arranging an optical filter on the first pattern section 10 and an optical filter on the second pattern section 20 of the mask, light of a preset wavelength can only selectively run through the first pattern section 10 or the second pattern section 20, so that corresponding pattern can be presented. For instance, the first wavelength λ1 may be 405 nm and the second wavelength λ2 may be 365 nm. Correspondingly, the first pattern section 10 may be provided with a narrow-band optical filter with a center wavelength of 405 nm, and the second pattern section 20 may be provided with an optical filter with a center wavelength of 365 nm. Of course, the first pattern section 10 and the second pattern section 20 of the mask provided by the embodiment may also be respectively provided with other optical filters commonly used in the field, as long as the wavelengths of light which can run through the optical filters of the two pattern sections are different from each other or not overlapped with each other.

In at least one example, in order to allow the first wavelength λ1 and the second wavelength λ2 to run through the non-pattern area 02, the non-pattern area 02 may be transparent. For instance, the mask provided by the embodiment may comprise a transparent base substrate. After the pattern areas are formed on the transparent base substrate, the portion of the transparent base substrate except the pattern areas may be taken as the non-pattern area.

In at least one example, in order to not allow any of the first wavelength λ1 and the second wavelength λ2 to run through the non-pattern area 02, the non-pattern area 02 may be opaque. For instance, the mask provided by the embodiment may comprise a transparent substrate, and the portion of the transparent base substrate disposed on the outside of the pattern areas is provided with an opaque material such as a reflecting film or black resin, so as to form the non-pattern area.

Figure 1B:
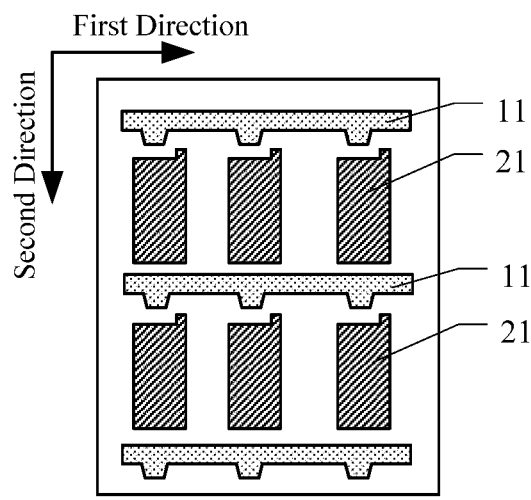
FIG. 1b is a schematic partial top view of another mask provided by a first embodiment of the present disclosure.

For instance, for the mask provided by the embodiment, masks for patterning a plurality of layers (e.g., a transparent electrode layer and a gate metal layer) on an array substrate may be combined into one mask. For instance, as illustrated in FIG. 1b, one of the first pattern section 10 and the second pattern section 20 may include a plurality of sub-patterns 11; the plurality of sub-patterns 11 are arranged in a plurality of rows; each row of sub-patterns 11 are sequentially arranged along first direction; the plurality of rows of sub-patterns 11 are sequentially arranged along second direction; the other of the first pattern section 10 and the second pattern section 20 may include a plurality of linear structures 21; each linear structure 21 extends along the first direction; and the plurality of linear structures 21 are sequentially arranged in parallel along the second direction. For instance, in the mask provided by the embodiment, one of the first pattern section 10 and the second pattern section 20 may be used for forming a transparent electrode layer (e.g., a pixel electrode layer) on the array substrate, and the other of the first pattern section 10 and the second pattern section 20 may be used for forming a gate metal layer on the array substrate.

Detailed description will be given below with respect to the patterning method employing the mask (as shown in FIGS. 1a and 1b) provided by the embodiment with reference to FIGS. 2a to 2f.

In the case where the first wavelength λ1 and the second wavelength λ2 can run through the non-pattern area 02 of the mask provided by the embodiment, the patterning method employing the mask provided by the embodiment may comprise the following steps S111 to S116. Detailed description will be given below with respect to the steps with reference to FIGS. 2a to 2f.

Figure 2A:
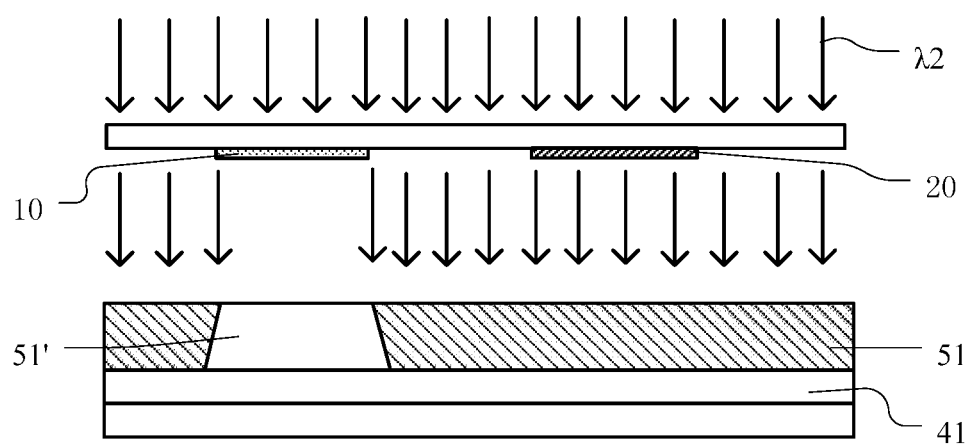
FIGS. 2a to 2f are schematic diagrams of various steps of a patterning method employing the mask provided by the first embodiment of the present disclosure.

S111: sequentially forming a first film 41 and first positive photoresist 51 on the first film 41, as shown in FIG. 2a.

S112: irradiating the first positive photoresist 5 via the mask with the light of the second wavelength λ2, as shown in FIG. 2a.

As the light of the second wavelength λ2 cannot run through the first pattern section 10 while can run through the second pattern section 20 and the non-pattern area, when the mask is irradiated by the light of the second wavelength λ2, the portion 51' of the first positive photoresist 51 corresponding to the first pattern section 10 is not exposed and hence does not change, and the rest portions of the first positive photoresist 51 are exposed and change.

Figure 2B:
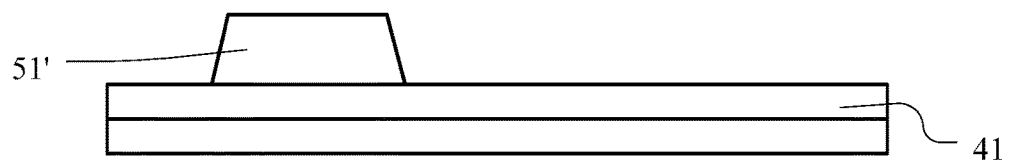
Figure 2C:
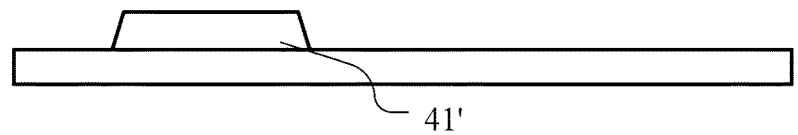

S113: forming a first film pattern 41' after first development (as shown in FIG. 2b) and first etching, as shown in FIG. 2c.

In the process of first development, the exposed portion of the first positive photoresist 51 is removed and the non-exposed portion is retained, so a first positive photoresist pattern 51' is obtained, as shown in FIG. 2b. The first film pattern 41' consistent with the pattern of the first pattern section 10 can be obtained after etching the first film 41 by utilization of the first positive photoresist pattern 51', as shown in FIG. 2c.

Figure 2D:
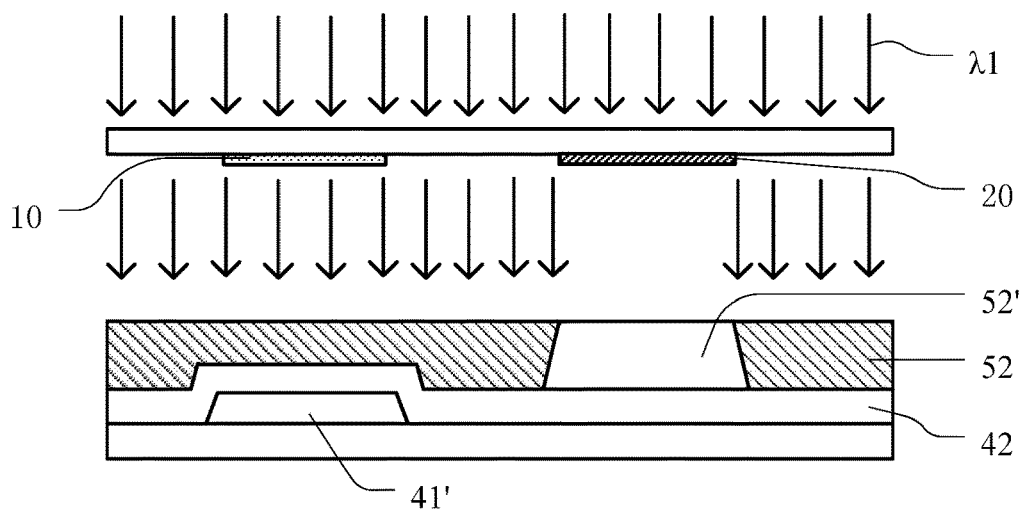

S114: sequentially forming a second film 42 on the first film pattern 41' and second positive photoresist 52 on the second film 42, as shown in FIG. 2d.

S115: irradiating the second positive photoresist 52 via the mask with the light of the first wavelength λ1, as shown in FIG. 2d.

As the light of the first wavelength λ1 cannot run through the second pattern section 20 while can run through the first pattern section 10 and the non-pattern area, when the mask is irradiated by the light of the first wavelength λ1, the portion 52' of the second positive photoresist 52 corresponding to the second pattern section 20 is not exposed and hence does not change, and the rest portions of the second positive photoresist 52 are exposed and change.

Figure 2E:
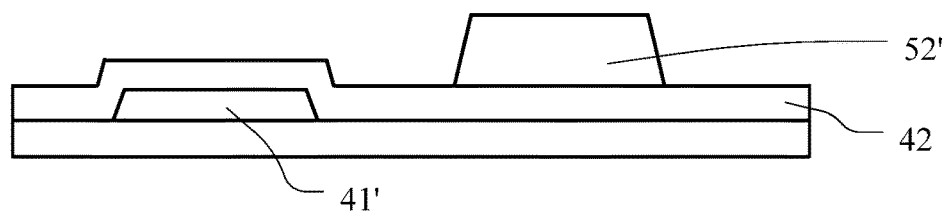
Figure 2F:
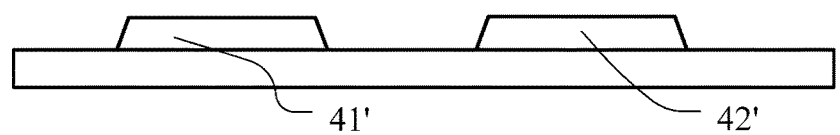

S116: forming a second film pattern 42' after second development (as shown in FIG. 2e) and second etching, as shown in FIG. 2f.

In the process of second development, the exposed portion of the second positive photoresist 52 is removed and the non-exposed portion is retained, so a second positive photoresist pattern 52' is obtained, as shown in FIG. 2e. The second film pattern 42' consistent with the pattern of the second pattern section 20 can be obtained after etching the second film 42 by utilization of the second positive photoresist pattern 52', as shown in FIG. 2f.

For instance, in the above step, $\lambda 1$ may be 436 mn and $\lambda 2$ may be 405 nm; the first pattern section 10, for instance, may be provided with a bandpass optical filter with a center wavelength of 436 nm (the light of the wavelength of 405 nm cannot run through the bandpass optical filter), and the second pattern section 20, for instance, may be provided with a narrow-band optical filter with a center wavelength of 405 nm (a light of the wavelength of 436 nm cannot run through the narrow-band optical filter); and the first positive photoresist may be H ray (405 nm) positive photoresist, and the second positive photoresist may be G ray (436 nm) positive photoresist. Of course, the embodiment includes but not limited thereto the above examples.

It should be noted that the first positive photoresist and the second positive photoresist may also be the same photoresist, as long as the photoresist can sense both the light of the first wavelength $\lambda 1$ and the light of the second wavelength $\lambda 2$.

Description is given to the method provided by the embodiment by taking the positive photoresist as an example. In addition, the patterning method employing the mask (as shown in FIGS. 1a and 1b) provided by the embodiment may also adopt negative photoresist.

For instance, in the case where any of the light of the first wavelength $\lambda 1$ and the light of the second wavelength $\lambda 2$ cannot run through the non-pattern area 02 of the mask provided by the embodiment, the patterning method employing the mask provided by the embodiment may comprise the following steps S121 to S126. Detailed description will be given below to the steps.

S121: sequentially forming a first film and first negative photoresist on the first film.

S122: irradiating the first negative photoresist via the mask with the light of the first wavelength $\lambda 1$.

As the light of the first wavelength $\lambda 1$ can run through the first pattern section 10 while cannot run through the second pattern section 20 and the non-pattern area 02, when the mask is irradiated by the light of the first wavelength $\lambda 1$, the portion of the first negative photoresist corresponding to the first pattern section 10 is exposed and changes, and the rest portions of the first negative photoresist are not exposed and do not change.

S123: forming a first film pattern after first development and first etching.

In the process of first development, the non-exposed portion of the first negative photoresist is removed and the exposed portion is retained, so a first negative photoresist pattern is obtained. The first film pattern consistent with the pattern of the first pattern section 10 may be obtained after etching the first film by utilization of the first negative photoresist pattern.

S124: sequentially forming a second film on the first film pattern and second negative photoresist on the second film.

S125: irradiating the second negative photoresist via the mask with the light of the second wavelength $\lambda 2$.

As the light of the second wavelength $\lambda 2$ can run through the second pattern section 20 while cannot run through the first pattern section 10 and the non-pattern section 02, when the mask is irradiated by the light of the second wavelength $\lambda 2$, the portion of the second negative photoresist corresponding to the second pattern section 20 is exposed and changes, and the rest portions of the second negative photoresist are not exposed and do not change.

S126: forming a second film pattern after second development and second etching.

In the second development process, the non-exposed portion of the second negative photoresist is removed and the exposed portion is retained, so a second negative photoresist pattern is obtained. The second film pattern consistent with the pattern of the second pattern section 20 may be obtained after etching the second film by utilization of the second negative photoresist pattern.

For instance, in the steps S121 to S126, $\lambda 1$ may be 248 nm and $\lambda 2$ may be 193 nm; the first pattern section, for instance, may be provided with a bandpass interference filter with a center wavelength of 248 nm (the light of the wavelength of 193 nm cannot run through the bandpass interference filter), and the second pattern section, for instance, may be provided with a bandpass interference filter with a center wavelength of 193 nm (light of the wavelength of 248 nm cannot run through the bandpass interference filter); and the first negative photoresist may be negative photoresist for the wavelength of 248 nm, and the second negative photoresist may be negative photoresist for the wavelength of 193 nm. Of course, the embodiment includes but not limited thereto the above examples.

It should be noted that the first negative photoresist and the second negative photoresist may also be the same photoresist, as long as the photoresist can sense both the light of the first wavelength of $\lambda 1$ and the light of the second wavelength of $\lambda 2$.

The first pattern section 10 of the mask provided by the embodiment may be used for forming a transparent electrode layer (e.g., a pixel electrode layer) on an array substrate, and the second pattern section 20 may be used for forming a gate metal layer on the array substrate. Correspondingly, in the method provided by the embodiment, for instance, the material of one of the first film and the second film may include conductive metal oxide, and/or the material of the other of the first film and the second film may include metal. For instance, the conductive metal oxide may include indium zinc oxide (IZO), indium tin oxide (ITO), indium gallium zinc oxide (IGZO) or the like, and the metal may include aluminum, magnesium, copper, zirconium, titanium, molybdenum or the like.

Moreover, as an insulating layer is generally formed between the gate metal layer and the transparent electrode layer on the array substrate, in the manufacturing method provided by the embodiment, for instance, an insulating layer (not shown in FIGS. 2a to 2f) may also be formed on the first film pattern 41' after the step of forming the first film pattern 41' and before the step of forming the second film 42.

It should be noted that: in the mask and the patterning method employing the mask, provided by the embodiment, the description that the light of the first wavelength $\lambda 1$ can run through the first pattern section and the light of the second wavelength $\lambda 2$ cannot run through the first pattern section refers to that: the transmittance of the first pattern section for the light of the first wavelength $\lambda 1$ is far greater than the transmittance of the first pattern section for the light of the second wavelength $\lambda 2$ (the transmittance on the light of the second wavelength $\lambda 2$ may be 0 and may also be more than 0). Similarly, the description that the light of the second wavelength $\lambda2$ can run through the second pattern section and the light of the first wavelength $\lambda1$ cannot run through the second pattern section refers to that: the transmittance of the second pattern section for the light of the second wavelength $\lambda2$ is far greater than the transmittance of the second pattern section for the light of the first wavelength $\lambda1$ (the transmittance on the light of the first wavelength $\lambda1$ may be 0 and may also be more than 0).

Second Embodiment

The embodiment provides another mask and a patterning method employing the mask. Compared with the first embodiment, the mask provided by the embodiment simultaneously comprises three pattern sections which are not overlapped with each other. Moreover, light of different wavelengths can respectively run through the three pattern sections. Thus, three film patterns can be formed by respectively patterning three films via the mask, so that two masks can be saved.

Figure 3A:
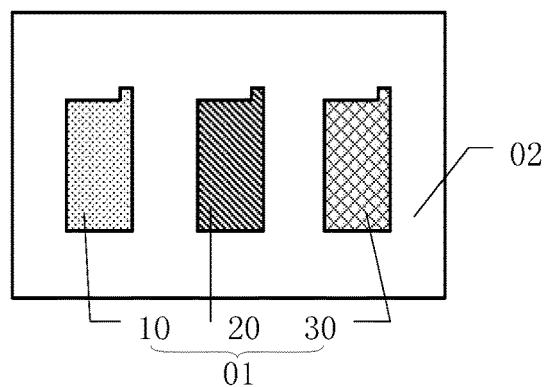
FIG. 3a is a schematic partial top view of a mask provided by a second embodiment of the present disclosure.

For instance, as illustrated in FIG. 3a, a pattern area 01 is further provided with a third pattern section 30 which is not overlapped with a first pattern section 10 and a second pattern section 20. The third pattern section 30 may be arranged by the following modes.

First mode. In the case where any one of the light of a first wavelength $\lambda1$ and the light of a second wavelength $\lambda2$ cannot run through the non-pattern area 02, the light of a third wavelength $\lambda3$ can run through the third pattern section 30 and any one of the light of the first wavelength $\lambda1$ and the light of the second wavelength $\lambda2$ cannot run through the third pattern section 30, and the light of the third wavelength $\lambda3$ cannot run through the first pattern section 10, the second pattern section 20 and the non-pattern area 02. That is to say, the light of the first wavelength can run through the first pattern section 10 but the light of the second wavelength and the light of the third wavelength cannot run through the first pattern section 10; the light of the second wavelength can run through the second pattern section 20 but the light of the first wavelength and the light of the third wavelength cannot run through the second pattern section 20; the light of the third wavelength can run through the third pattern section 30 but the light of the first wavelength and the light of the second wavelength cannot run through the third pattern section 30; and any one of the light of the first wavelength, the light of the second wavelength and the light of the third wavelength cannot run through the non-pattern area 02.

Second mode: in the case where the light of the first wavelength $\lambda1$ and the light of the second wavelength $\lambda2$ can run through the non-pattern area 02, the light of the first wavelength $\lambda1$ and the light of the second wavelength $\lambda2$ can run through the third pattern section 30 but the light of the third wavelength $\lambda3$ cannot run through the third pattern section 30, and the light of the third wavelength $\lambda3$ can run through the first pattern section 10, the second pattern section 20 and the non-pattern area 02. That is to say, the light of the first wavelength and the light of the third wavelength can run through the first pattern section 10 but the light of the second wavelength cannot run through the first pattern section 10; the light of the second wavelength and the light of the third wavelength can run through the second pattern section 20 but the light of the first wavelength cannot run through the second pattern section 20; the light of the first wavelength and the light of the second wavelength can run through the third pattern section 30 but the light of the third wavelength cannot run through the third pattern section 30; and any one of the light of the first wavelength, the light of the second wavelength and the light of the third wavelength can run through the non-pattern area 02.

Figure 4:
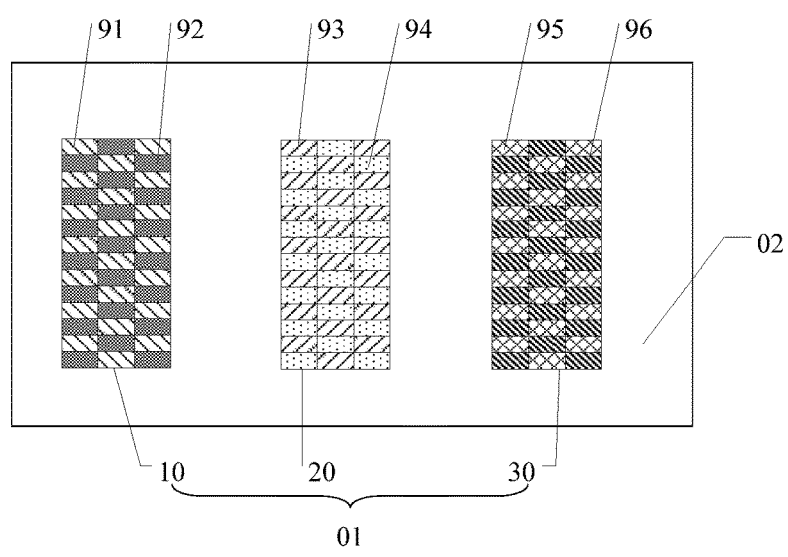
FIG. 4 is a schematic partial top view of still another mask provided by the second embodiment of the present disclosure.

In the second mode, for instance, as illustrated in FIG. 4, the first pattern section 10 may be provided with a plurality of first filter patterns 91 and a plurality of second filter patterns 92; the plurality of first filter patterns 91 and the plurality of second filter patterns 92 are arranged into a plurality of filter pattern rows and a plurality of filter pattern columns; in each filter pattern row and each filter pattern column, one second filter pattern 92 is disposed between adjacent first filter patterns 91, and one first filter pattern 91 is disposed between adjacent second filter patterns 92; the light of the first wavelength can run through each first filter pattern 91 but the light of the second wavelength cannot run through the first filter pattern 91; and the light of the third wavelength can run through each second filter pattern 92 but the light of the second wavelength cannot run through the second filter pattern 92. In the example, the maximum dimension of the first filter pattern 91 and the maximum dimension of the second filter pattern 92 are set to be less than the resolution of an exposure machine used in the exposure process using the mask, so that patterns of the first filter patterns and the second filter patterns cannot be presented onto photoresist. Moreover, the light of the first wavelength running through the first filter patterns or the light of the third wavelength running through the second filter patterns is diffracted, so that the pattern of the entire first pattern section is transferred onto the photoresist, and hence the light of the first wavelength and the light of the third wavelength can run through the first pattern section but the light of the second wavelength cannot run through the first pattern section.

In the second mode, for instance, as illustrated in FIG. 4, the second pattern section 20 may be provided with a plurality of third filter patterns 93 and a plurality of fourth filter patterns 94; the plurality of third filter patterns 93 and the plurality of fourth filter patterns 94 are arranged into a plurality of filter pattern rows and a plurality of filter pattern columns; in each filter pattern row and each filter pattern column, one fourth filter pattern 94 is disposed between adjacent third filter patterns 93, and one third filter pattern 93 is disposed between adjacent fourth filter patterns 94; the light of the second wavelength can run through each third filter pattern 93 but the light of the first wavelength cannot run through the third filter pattern 93; and the light of the third wavelength can run through each fourth filter pattern 94 but the light of the first wavelength cannot run through the fourth filter pattern 94. In the example, the maximum dimension of the third filter pattern 93 and the maximum dimension of the fourth filter pattern 94 are set to be less than the resolution of the exposure machine, so that the light of the second wavelength and the light of the third wavelength can run through the second pattern section but the light of the first wavelength cannot run through the second pattern section. The principle is similar to that of the first pattern section. No further description will be given here.

In the second mode, for instance, as illustrated in FIG. 4, the third pattern section 30 may be provided with a plurality of fifth filter patterns 95 and a plurality of sixth filter patterns 96; the plurality of fifth filter patterns 95 and the plurality of sixth filter patterns 96 are arranged into a plurality of filter pattern rows and a plurality of filter pattern columns; in each filter pattern row and each filter pattern column, one sixth filter pattern 96 is disposed between adjacent fifth filter patterns 95, and one fifth filter pattern 95 is disposed between adjacent sixth filter patterns 96; the light of the first wavelength can run through each fifth filter pattern 95 but the light of the third wavelength cannot run through the fifth filter pattern 95; and the light of the second wavelength can run through each sixth filter pattern 96 but the light of the third wavelength cannot run through the sixth filter pattern 96. In the example, the maximum dimension of the fifth filter pattern 95 and the maximum dimension of the sixth filter pattern 96 are set to be less than the resolution of the exposure machine, so that the light of the first wavelength and the light of the second wavelength can run through the third pattern section but the light of the third wavelength cannot run through the third pattern section. The principle is similar to that of the first pattern section. No further description will be given here.

In the above examples, the maximum dimension of each filter pattern refers to the maximum distance between two points on edges of a flat shape (the shape on a plane provided with the first pattern section, the second pattern section and the third pattern section) of each filter pattern; the flat shape of each filter pattern includes but not limited to the case as shown in FIG. 4, for instance, may also be a right triangle or other shapes; and the resolution of the exposure machine may be selected according to actual demands and is not limited in the embodiment of the present disclosure. In addition, the means of arranging a bandpass optical filter or other means commonly used in the field may also be adopted to achieve the objective that light of two wavelengths can run through the first pattern section, the second pattern section and the third pattern section but light of another wavelength cannot run through the first pattern section, the second pattern section and the third pattern section.

Currently, the commonly used photoresist includes UV photoresist, and the first wavelength λ1, the second wavelength λ2 and the third wavelength λ3 may all be 10 nm-450 nm. The first wavelength λ1, the second wavelength λ2 and the third wavelength λ3 may all be a single wavelength or a wavelength range and are different from each other or not overlapped with each other.

Figure 3B:
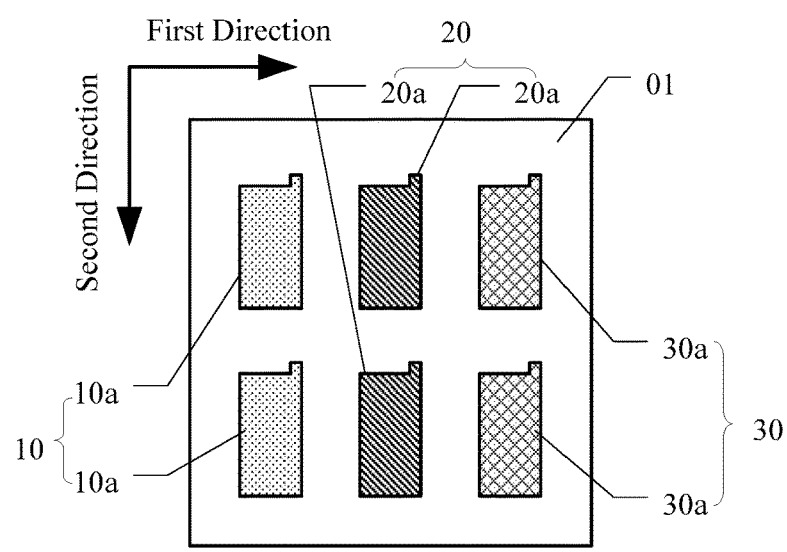
FIG. 3b is a schematic partial top view of another mask provided by the second embodiment of the present disclosure.

For instance, as illustrated in FIG. 3b, the first pattern section 10 may include a plurality of mutually spaced first sub-patterns 10a; the second pattern section 20 may include a plurality of mutually spaced second sub-patterns 20a, and the third pattern section 30 may include a plurality of mutually spaced third sub-patterns 30a.

Moreover, for instance, the plurality of first sub-patterns 10a of the first pattern section 10, the plurality of second sub-patterns 20a of the second pattern section 20, and the plurality of third sub-patterns 30a of the third pattern section 30 may be combined into a plurality of pattern groups (two pattern groups are shown in FIG. 3b); and each pattern group includes at least one first sub-pattern 10a, at least one second sub-pattern 20a and at least one third sub-pattern 30a.

For instance, the mask provided by the embodiment may be a mask for forming a color filter (CF) layer. That is to say, in the embodiment, a plurality of commonly used masks for forming the CF layer may be combined into one mask.

In the case where any of the light of the first wavelength λ1 and the light of the second wavelength λ2 cannot run through the non-pattern area of the mask (namely the mask adopting the first means), the patterning method employing the mask provided by the embodiment comprises the steps S121 to S126 described in the first embodiment. That is to say, the first negative photoresist disposed on the first film 41 is irradiated by the light of the first wavelength λ1 and the second negative photoresist disposed on the second film 42 is irradiated by the light of the second wavelength λ2. On this basis, the method may further comprise: irradiating third negative photoresist disposed on a third film via the mask with the light of the third wavelength λ; and forming a third film pattern after third development and third etching.

That is to say, in the case any of the light of the first wavelength λ1 and the light of the second wavelength λ2 cannot run through the non-pattern section of the mask, the patterning method employing the mask provided by the embodiment may comprise the following steps S221 to S229. Detailed description will be given below to the steps with reference to FIGS. 5a to 5i.

S221: sequentially forming a first film 41 and first negative photoresist 61' on the first film 41.

S222: irradiating the first negative photoresist 61 via the mask with the light of the first wavelength λ1.

As the light of the first wavelength λ1 can run through the first pattern section 10 and cannot run through the second pattern section 20, the third pattern section 30 and the non-pattern area 02, when the mask is irradiated by the light of the first wavelength the portion 61' of the first negative photoresist 61 corresponding to the first pattern section 10 is exposed and changes, and the rest portions of the first negative photoresist 61 are not exposed and do not change.

Figure 5A:
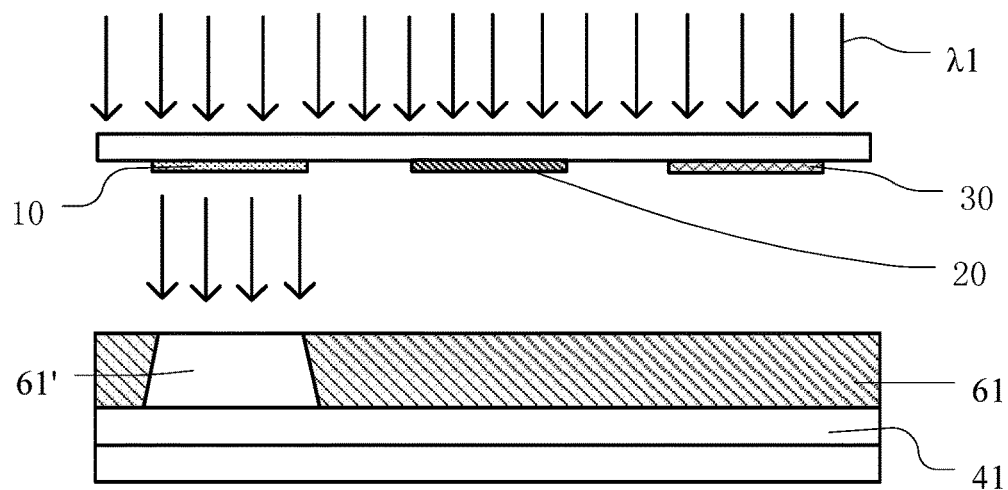
FIGS. 5a to 5i are schematic diagrams of various steps of a patterning method employing the mask provided by the second embodiment of the present disclosure.
Figure 5B:
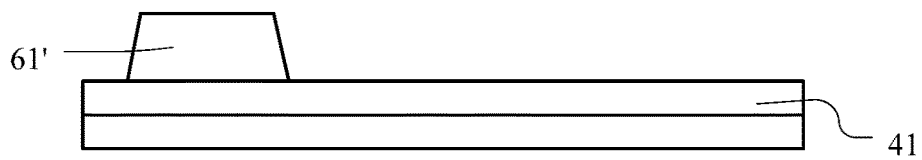
Figure 5C:
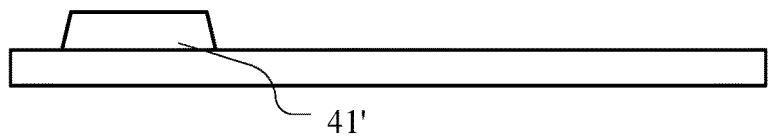

S223: forming a first film pattern 41' after first development (as shown in FIG. 5b) and first etching, as shown in FIG. 5c.

In the process of first development, the non-exposed portion of the first negative photoresist 61 is removed but the exposed portion is retained, so a first negative photoresist pattern 61' is obtained, as shown in FIG. 5b. The first film pattern 41' consistent with the pattern of the first pattern section 10 may be obtained after etching the first film 41 by utilization of the first negative photoresist pattern 61', as shown in FIG. 5c.

Figure 5D:
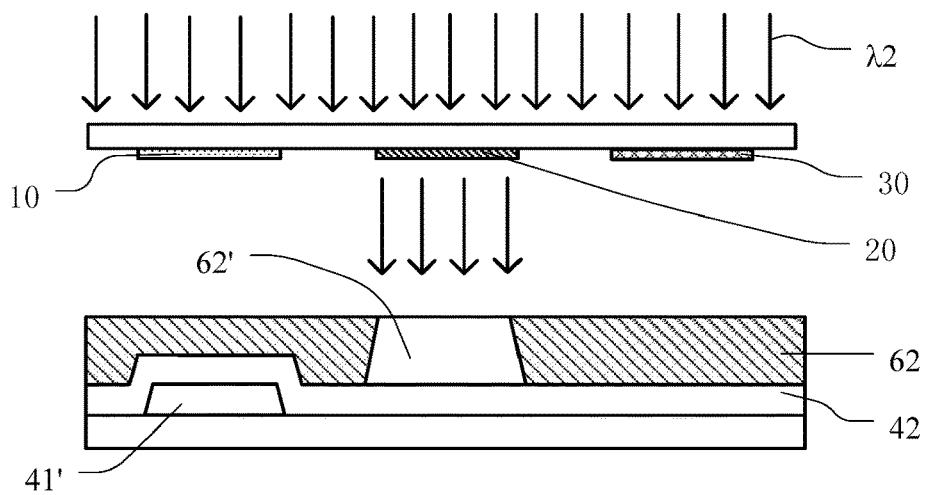

S224: sequentially forming a second film 42 on the first film pattern 41' and second negative photoresist 62 on the second film 42, as shown in FIG. 5d.

S225: irradiating the second negative photoresist 62 via the mask with the light of the second wavelength λ2, as shown in FIG. 5d.

As the light of the second wavelength λ2 can run through the second pattern section 20 and cannot run through the first pattern section 10, the third pattern section 30 and the non-pattern area 02, when the mask is irradiated by the light of the second wavelength λ2, the portion 62' of the second negative photoresist 62 corresponding to the second pattern section 20 is exposed and changes, and the rest portions of the second negative photoresist 62 are not exposed and do not change.

Figure 5E:
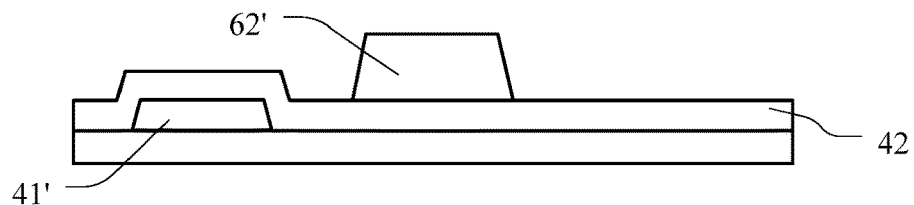
Figure 5F:
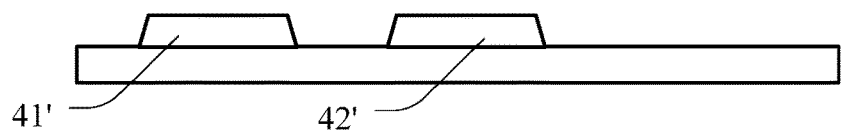

S226: forming a second film pattern 42' after second development (as shown in FIG. 5e) and second etching, as shown in FIG. 5f.

In the process of second development, the non-exposed portion of the second negative photoresist 62 is removed but the exposed portion is retained, so a second negative photoresist pattern 62' is obtained, as shown in FIG. 5c. The second film pattern 42' consistent with the pattern of the second pattern section 20 may be obtained after etching the second film 42 by utilization of the second negative photoresist pattern 62', as shown in FIG. 5f.

Figure 5G:
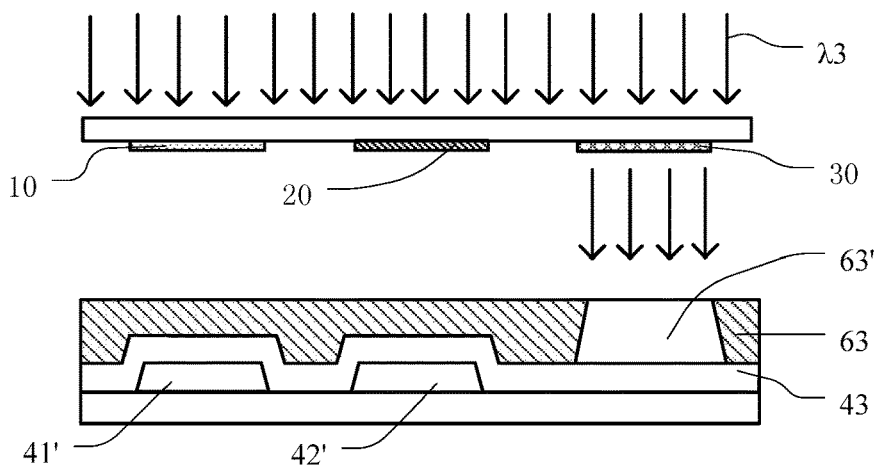

S227: sequentially forming a third film 43 on the first film pattern 41' and the second film pattern 42' and third negative photoresist 63 on the third film 43, as shown in FIG. 5g.

S228: irradiating the third negative photoresist 63 via the mask with the light of the third wavelength λ3, as shown in FIG. 5g.

As the light of the third wavelength λ3 can run through the third pattern section 30 and cannot run through the first pattern section 10, the second pattern section 20 and the non-pattern area 02, when the mask is irradiated by the light of the third wavelength λ3, the portion 63' of the third negative photoresist 63 corresponding to the third pattern section 30 is exposed and changes, and the rest portions of the third negative photoresist 63 are not exposed and do not change.

Figure 5H:
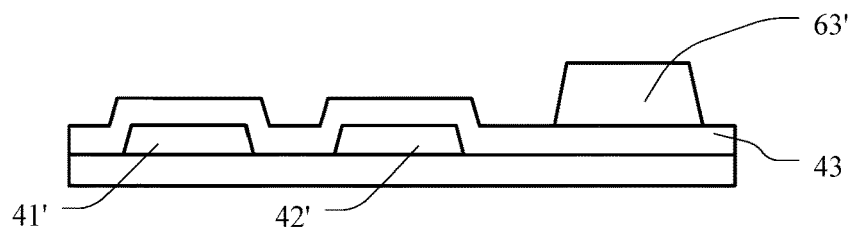
Figure 5I:
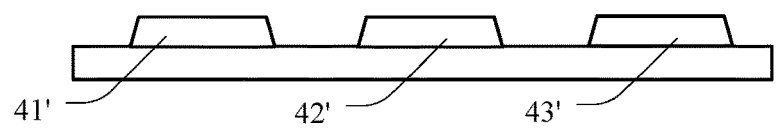

S229: forming a third film pattern 43' after third development (as shown in FIG. 5h) and third etching, as shown in FIG. 5i.

In the process of third development, the non-exposed portion of the third negative photoresist 63 is removed but the exposed portion is retained, so a third negative photoresist pattern 63' is obtained, as shown in FIG. 5h. The third film pattern 43' consistent with the pattern of the third pattern section 30 may be obtained after etching the third film 43 by utilization of the third negative photoresist pattern 63', as shown in FIG. 5i.

For instance, in the steps S221 to S229, λ1 may be 248 nm; λ2 may be 193 nm; λ3 may be 157 nm; the first pattern section 10, for instance, may be provided with a bandpass interference filter with a center wavelength of 248 nm (light of the wavelength of 157 nm and light of the wavelength of 193 nm cannot run through the filter); the second pattern section 20, for instance, may be provided with a bandpass interference filter with a center wavelength of 193 nm (light of the wavelength of 248 nm and the light of the wavelength of 157 nm cannot run through the filter); the third pattern section 30, for instance, may be provided with a UV bandpass filter with a center wavelength of 157 nm (the light of the wavelength of 248 nm and the light of the wavelength of 193 nm cannot run through the filter); the first negative photoresist may be negative photoresist for 248 nm wavelength; the second negative photoresist may be negative photoresist for 193 nm wavelength; and the third negative photoresist may be negative photoresist for 157 nm wavelength. Of course, the embodiment includes but not limited thereto the above examples.

It should be noted that the first negative photoresist, the second negative photoresist and the third negative photoresist may also be the same photoresist, as long as the photoresist can all sense the light of the first wavelength λ1, the light of the second wavelength λ2 and the light of the third wavelength λ3.

Description is given to the method provided by the embodiment by taking the negative photoresist as an example. In addition, the patterning method employing the mask (as shown in FIGS. 3a and 3b) provided by the embodiment may also adopt positive photoresist.

For instance, in the case where the light of the first wavelength λ1 and the light of the second wavelength λ2 can run through the non-pattern area of the mask (namely the mask adopting the second means), the patterning method employing the mask provided by the embodiment comprises the steps S111 to S116 described in the first embodiment. That is to say, the first positive photoresist 51 disposed on the first film 41 is irradiated by the light of the second wavelength λ2 and the second positive photoresist 52 disposed on the second film 42 is irradiated by the light of the first wavelength λ1. On this basis, the method may also comprise the following steps S217 to S219. Detailed description will be given below to the steps with reference to FIGS. 6a to 6c.

Figure 6A:
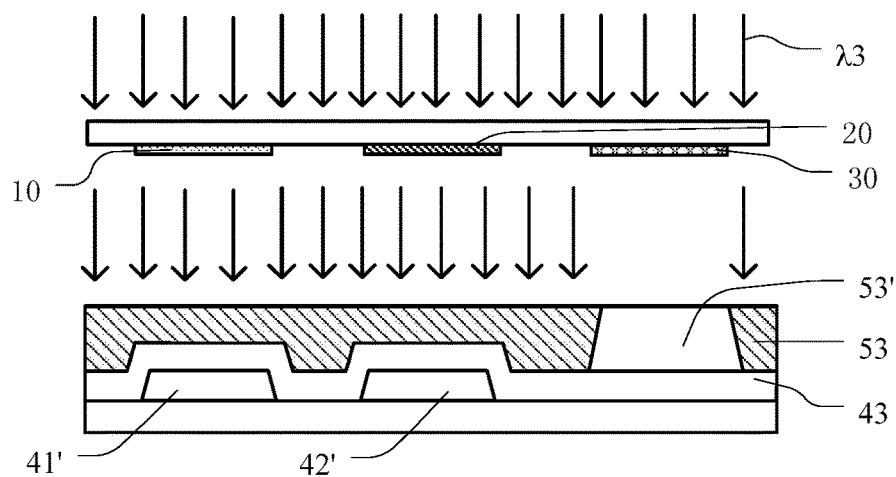
FIGS. 6a to 6c are schematic diagrams of various steps of a process for forming a third film pattern via the mask provided by the second embodiment of the present disclosure.

S217: sequentially forming a third film 43 on the first film pattern 41' and the second film pattern 42' and third positive photoresist 53 on the third film 43, as shown in FIG. 6a.

S218: irradiating the third positive photoresist 53 via the mask with the light of the third wavelength λ3, as shown in FIG. 6a.

As the light of the third wavelength λ3 cannot run through the third pattern section 30 and can run through the first pattern section 10, the second pattern section 20 and the non-pattern area 02, when the mask is irradiated by the light of the third wavelength λ3, the portion 53' of the third positive photoresist 53 corresponding to the third pattern section 30 is not exposed and does not change, and the rest portions of the third positive photoresist 53 are exposed and change.

Figure 6B:
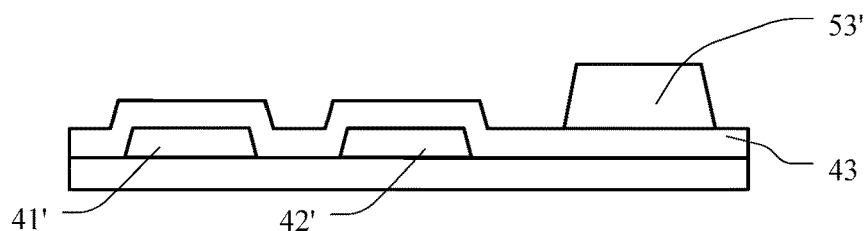
Figure 6C:
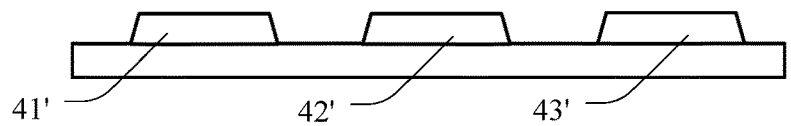

S219: forming a third film pattern 43' after third development (as shown in FIG. 6b) and third etching, as shown in FIG. 6c.

In the process of third development, the exposed portion of the third positive photoresist 53 is removed and the non-exposed portion is retained, so a third positive photoresist pattern 53' is obtained, as shown in FIG. 6b. The third film pattern 43' consistent with the pattern of the third pattern section 30 may be obtained after etching the third film 43 by utilization of the third positive photoresist pattern 53', as shown in FIG. 6c.

For instance, in the above steps, λ1 may be 436 nm; λ2 may be 405 nm; λ3 may be 365 nm; the first pattern section 10 may be provided with a narrow-band optical filter which allows the light of the wavelength of 436 nm and the light of the wavelength of 365 nm to run through but does not allow the light of the wavelength of 405 nm to run through; for instance, the first pattern section 10 is provided with first filter patterns adopting optical filters for 436 nm wavelength and second filter patterns adopting optical filters for 365 nm wavelength, which are alternately arranged; the second pattern section 20 may be provided with a narrow-band optical filter which allows the light of the wavelength of 405 nm and the light of the wavelength of 365 nm to run through but does not allow the light of the wavelength of 436 nm to run through; for instance, the second pattern section is provided with third filter patterns adopting optical filters for 405 nm wavelength and fourth filter patterns adopting optical filters for 365 nm wavelength, which are alternately arranged; the third pattern section 30 may be provided with a narrow-band optical filter which allows the light of the wavelength of 436 nm and the light of the wavelength of 405 nm to run through and does not allow the light of the wavelength of 365 nm to run through; for instance, the third pattern section is provided with fifth filter patterns adopting optical filter for 436 nm wavelength and sixth filter patterns adopting optical filter for 405 nm wavelength, which are alternately arranged; the first positive photoresist may be H-ray (405 nm) positive photoresist; the second positive photoresist may be G-ray (436 nm) positive photoresist; and the third positive photoresist may be I-ray (365 nm) positive photoresist. Of course, the embodiment includes but not limited thereto.

It should be noted that the first positive photoresist, the second positive photoresist and the third positive photoresist may be the same photoresist, as long as the photoresist can all sense the light of the first wavelength λ1, the light of the second wavelength λ2 and the light of the third wavelength λ3.

As the mask provided by the embodiment may be a mask for forming a CF layer. Correspondingly, in the patterning method employing the mask provided by the embodiment, for instance, the material of the first film 41 may include an optical filter material of first color; the material of the second film 42 may include an optical filter material of second color; the material of the third film 43 may include an optical filter material of third color; and the first color, the second color and the third color are different from each other. For instance, the material of one of the first film 41, the second film 42 and the third film 43 includes a red optical filter material; the material of another of the first film 41, the second film 42 and the third film 43 includes a green optical filter material; and the material of still another of the first film 41, the second film 42 and the third film 43 includes a blue optical filter material.

It should be noted that: in the mask and the patterning method employing the mask, provided by the embodiment, the transmittance of each pattern section among the first pattern section, the second pattern section and the third pattern section, for the light which can run through the pattern section, is far greater than the transmittance of the pattern section for the light which cannot run through the pattern section. Moreover, the transmittance of the pattern section for the light which cannot run through the pattern section may be 0 and may also be more than 0.

Third Embodiment

The embodiment provides a method for manufacturing a mask. The manufacturing method may comprise steps S31 and S32. Detailed description will be given below with reference to FIG. 7h.

S31: forming a pattern area 01 on a base substrate 70, in which the pattern area 01 is provided with a first pattern section 10 and a second pattern section 20 which are not overlapped with each other; light of a first wavelength $\lambda 1$ can run through the first pattern section 10 but light of a second wavelength $\lambda 2$ cannot run through the first pattern section 10; and the light of the second wavelength $\lambda 2$ can run through the second pattern section 20 but the light of the first wavelength $\lambda 1$ cannot run through the second pattern section 20.

S32: taking a portion of the base substrate 70, disposed on the outside of an orthographic projection of the pattern area 01 on the base substrate 70, as a non-pattern area (not marked in FIG. 7h), in which the light of the first wavelength $\lambda 1$ and the light of the second wavelength $\lambda 2$ can run through the non-pattern area; or forming a non-pattern area on the portion of the base substrate 70, disposed on the outside of the orthographic projection of the pattern area on the base substrate 70, in which any of the light of the first wavelength $\lambda 1$ and the light of the second wavelength $\lambda 2$ cannot run through the non-pattern area. Description is given in FIG. 7h by taking the case of forming the non-pattern area on the portion of the base substrate 70, disposed on the outside of the orthographic projection of the pattern area 01 on the base substrate 70, as an example.

In the step S31, the step of forming the pattern area 01 may include the following steps S311 to S314.

Figure 7A:
FIGS. 7a to 7h are schematic diagrams of various steps of a method for manufacturing a mask by utilization of a manufacturing method of the mask provided by a third embodiment of the present disclosure.
Figure 7B:

S311: forming a first optical filter film 10' on the base substrate 70, as shown in FIG. 7a.

S312: forming the first pattern section 10 by patterning the first optical filter film 10'.

In the step, the patterning process, for instance, includes the steps such as photoresist coating, photoresist exposure, photoresist development, and the etching of a film layer by utilization of a photoresist pattern. In addition, the patterning process may also be other processes capable of forming a required pattern. For instance, the default pattern may be formed by 3D printing process.

Figure 7C:
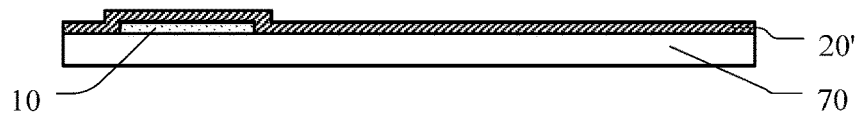

S313: forming a second optical filter film 20' on the base substrate 70, as shown in FIG. 7c.

Figure 7D:
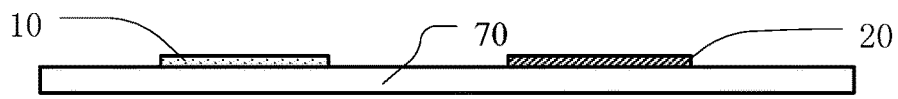

S314: forming the second pattern section 20 by patterning the second optical filter film 20', as shown in FIG. 7d.

In the step, for instance, both the first optical filter film 10' and the second optical filter film 20' may adopt filters from the market. For instance, the first optical filter film 10' and the second optical filter film 20' may respectively adopt a bandpass optical filter with a center wavelength of 436 nm and a narrow-band optical filter with a center wavelength of 405 nm. Of course, the embodiment includes but not limited thereto the above examples.

Figure 7E:
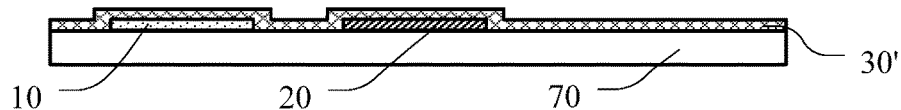
Figure 7F:
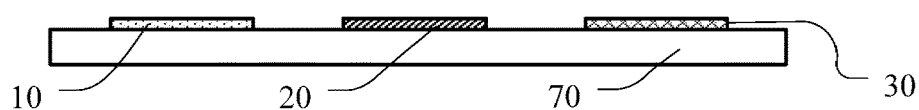
Figure 7G:
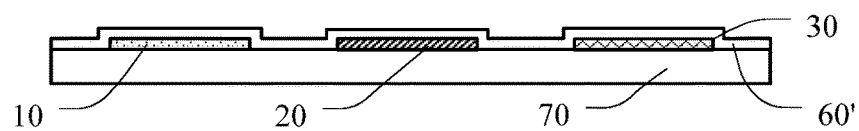
Figure 7H:
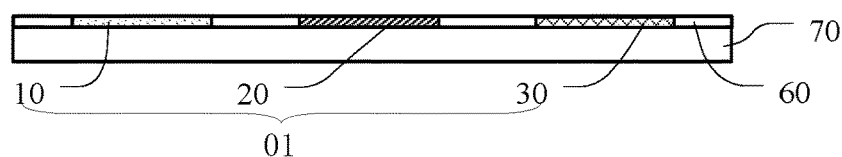

Moreover, in the step S31, the pattern area 01 may also be provided with a third pattern section 30 which is not overlapped with the first pattern section 10 and the second pattern section 20, as shown in FIG. 7h.

In the case of any of the light of the first wavelength $\lambda 1$ and the light of the second wavelength $\lambda 2$ cannot run through the non-pattern area, light of third wavelength $\lambda 3$ can run through the third pattern section 30 but any of the light of the first wavelength $\lambda 1$ and the light of the second wavelength $\lambda 2$ cannot run through the third pattern section 30, and the light of the third wavelength $\lambda 3$ cannot run through the first pattern section 10, the second pattern section 20 and the non-pattern area.

Alternatively in the case where the light of the first wavelength $\lambda 1$ and the light of the second wavelength $\lambda 2$ can run through the non-pattern area, the light of the first wavelength $\lambda 1$ and the light of the second wavelength $\lambda 2$ can run through the third pattern section 30 but the light of the third wavelength $\lambda 3$ cannot run through the third pattern section 30, and the light of the third wavelength $\lambda 3$ can run through the first pattern section 10, the second pattern section 20 and the non-pattern area.

In the case where the pattern area 01 is also provided with the third pattern section 30, the step S31 may also include: S315: forming a third optical filter film 30' on the base substrate, as shown in FIG. 7e; and S316: forming the third pattern section 30 by patterning the third optical filter film 30', as shown in FIG. 7f.

In the step S32, when the portion of the base substrate 70, disposed on the outside of the orthographic projection of the pattern area on the base substrate 70, is taken as the non-pattern area, for instance, the base substrate 70 may be transparent. For instance, the base substrate 70 may be a glass substrate, a quartz substrate, a plastic substrate, or the like.

Alternatively in the step S32, when the non-pattern area is formed on the portion of the base substrate 70, disposed on the outside of the orthographic projection of the pattern area on the base substrate 70, for instance, the base substrate 70 may be transparent, and an opaque material 60 may be formed on the portion of the base substrate 70, disposed on the outside of the orthographic projection of the pattern area, as shown in FIG. 7h. For instance, the opaque material may be a reflecting film, a black resin material or the like.

In the case where the opaque material 60 is formed on the non-pattern area, for instance, the step S32 of the method for manufacturing the mask provided by the embodiment may include: forming an opaque film 60' on the base substrate 70, as shown in FIG. 7g; and subsequently, forming the opaque material 60 by patterning the opaque film.

It should be noted that the sequence of forming the opaque materials 60, the first pattern section 10, the second pattern section 20 and the third pattern section 30 is not limited to the above example.

Fourth Embodiment

Figure 8:
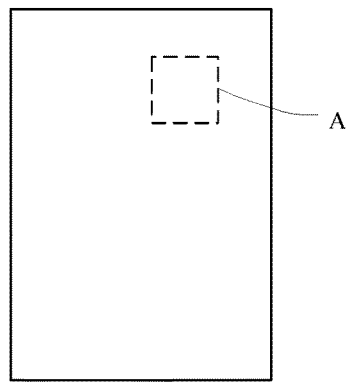
FIG. 8 is a schematic top view of a filter provided by a fourth embodiment of the present disclosure.
Figure 9A:
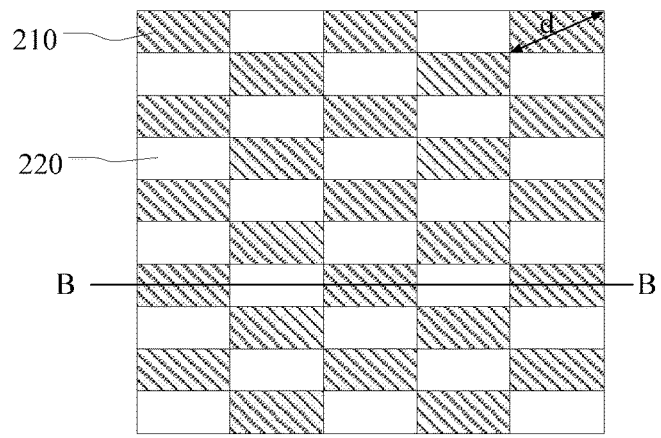
FIG. 9a is a schematic partial enlarged view of an A area in FIG. 8 provided by the fourth embodiment of the present disclosure.
Figure 9B:
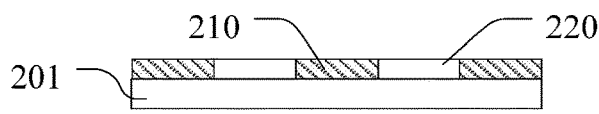

As illustrated in FIGS. 8 to 9b, the embodiment provides an optical filter 200. The optical filter 200 comprises a base substrate 201 and a plurality of first filter patterns 210 and a plurality of second filter patterns 220 disposed on the base substrate 201. The plurality of first filter patterns 210 and the plurality of second filter patterns 220 are arranged into a plurality of filter pattern rows and a plurality of filter pattern columns; in each filter pattern row and each filter pattern column, one second filter pattern 220 is disposed between adjacent first filter patterns 210, and one first filter pattern 210 is disposed between adjacent second filter patterns 220; light of a first wavelength can run through each first filter pattern 210; light of a second wavelength can run through each second filter pattern 220; and the first wavelength is different from the second wavelength.

For instance, the first filter pattern and the second filter pattern may be made from optical filter materials which allow light of different wavelengths or different wavelength ranges to run through.

In the embodiment, the maximum dimension of the first filter patterns 210 and the second filter patterns 220 is set, so the light of the first wavelength can be diffracted after running through the first filter pattern and the light of the second wavelength can be also diffracted after running through the second filter pattern. Thus, the light of the first wavelength and the light of the second wavelength can run through the filter 200.

For instance, the light of the first wavelength can run through the first filter pattern but the light of the third wavelength cannot run through the first filter pattern, and the light of the second wavelength can run through the second filter pattern but the light of the third wavelength cannot run through the second filter pattern. In this case, the filter, for instance, may be applied to the mask as shown in FIG. 4.

For instance, the maximum dimension d of the first filter pattern and the second filter pattern may be nanometer or micrometer. In this case, the filter, for instance, may be applied to the mask as shown in FIG. 4.

Figure 10:
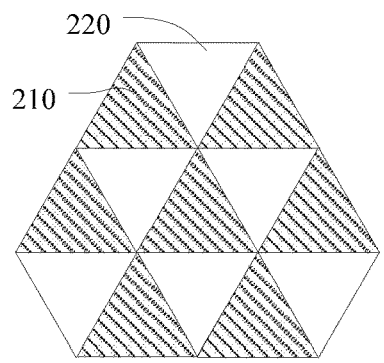
FIG. 10 is another schematic partial enlarged view of the A area in FIG. 8 provided by the fourth embodiment of the present disclosure.

For instance, the flat shape of each first filter pattern and each second filter pattern may be a rectangle, as shown in FIG. 9a; or the flat shape of each first filter pattern and each second filter pattern may be a right triangle, as shown in FIG. 10. Thus, each first filter pattern may be bonded to the second filter patterns adjacent to the first filter pattern, so that gaps between both can be avoided, and hence the phenomenon that the light runs through the gaps can be avoided as much as possible. Of course, the flat shape of the first filter pattern and the second filter pattern may also be other shapes.

What are described above is related to the illustrative embodiments of the disclosure only and not limitative to the scope of the disclosure; the scopes of the disclosure are defined by the accompanying claims.

The application claims priority to the Chinese patent application No. 201510680818.7, filed Oct. 19, 2015, the entire disclosure of which is incorporated herein by reference as part of the present application.

What is claimed is:

1. A mask, comprising a pattern area and a non-pattern area, wherein the pattern area is provided with a first pattern section and a second pattern section which are not overlapped with each other; light of a first wavelength can run through the first pattern section but light of a second wavelength cannot run through the first pattern section; the light of the second wavelength can run thorough the second pattern section but the light of the first wavelength cannot run through the second pattern section; and the light of the first wavelength and the light of the second wavelength can run through the non-pattern area, or any of the light of the first wavelength and the light of the second wavelength cannot run through the non-pattern area;

wherein one of the first pattern section and the second pattern section includes a plurality of sub-patterns; the plurality of sub-patterns is arranged into a plurality of rows; each row of sub-patterns are sequentially arranged along first direction; the plurality of rows of sub-patterns are sequentially arranged along second direction;

the other of the first pattern section and the second pattern section includes a plurality of linear structures; each linear structure extends along the first direction; and the plurality of linear structures are sequentially arranged in parallel along the second direction.

2. The mask according to claim 1, wherein the non-pattern area is transparent, or the non-pattern area is opaque.

3. The mask according to claim 1, wherein the first wavelength is from 10 nm-450 nm; the second wavelength is from 10 nm-450 nm; and the first wavelength is different from or not overlapped with the second wavelength.

4. The mask according to claim 1, wherein the pattern area is also provided with a third pattern section which is not overlapped with both the first pattern section and the second pattern section; and in a case where any of the light of the first wavelength and the light of the second wavelength cannot run through the non-pattern area, light of third wavelength can run through the third pattern section but any of the light of the first wavelength and the light of the second wavelength cannot run through the third pattern section, and the light of the third wavelength cannot run through the first pattern section, the second pattern section and the non-pattern area.

5. The mask according to claim 4, wherein the third wavelength is from 10 nm-450 nm.

6. The mask according to claim 4, wherein the first pattern section includes a plurality of mutually spaced first sub-patterns; the second pattern section includes a plurality of mutually spaced second sub-patterns; and the third pattern section includes a plurality of mutually spaced third sub-patterns.

7. The mask according to claim 6, wherein a plurality of pattern groups are formed by the plurality of first sub-patterns, the plurality of second sub-patterns and the plurality of third sub-patterns; and each pattern group includes at least one first sub-pattern, at least one second sub-pattern and at least one third sub-pattern.

8. The mask according to claim 1, wherein the pattern area is also provided with a third pattern section which is not overlapped with both the first pattern section and the second pattern section; and in the case where the light of the first wavelength and the light of the second wavelength can run through the non-pattern area, the light of the first wavelength and the light of the second wavelength can run through the third pattern section but light of third wavelength cannot run through the third pattern section, and the light of the third wavelength can run through the first pattern section, the second pattern section and the non-pattern area.

9. The mask according to claim 8, wherein
the first pattern section is provided with a plurality of first filter patterns and a plurality of second filter patterns; the plurality of first filter patterns and the plurality of second filter patterns are arranged into a plurality of filter pattern rows and a plurality of filter pattern columns; in each filter pattern row and each filter pattern column, one second filter pattern is disposed between adjacent first filter patterns, and one first filter pattern is disposed between adjacent second filter patterns;
the light of the first wavelength can run through each first filter pattern but the light of the second wavelength cannot run through the first filter pattern; and the light of the third wavelength can run through each second filter pattern but the light of the second wavelength cannot run through the second filter pattern.

10. The mask according to claim 8, wherein
the second pattern section is provided with a plurality of third filter patterns and a plurality of fourth filter patterns; the plurality of third filter patterns and the plurality of fourth filter patterns are arranged into a plurality of filter pattern rows and a plurality of filter pattern columns; in each filter pattern row and each filter pattern column, one fourth filter pattern is disposed between adjacent third filter patterns, and one third filter pattern is disposed between adjacent fourth filter patterns;
the light of the second wavelength can run through each third filter pattern but the light of the first wavelength cannot run through the third filter pattern; and the light of the third wavelength can run through each fourth filter pattern but the light of the first wavelength cannot run through the fourth filter pattern.

11. The mask according to claim 8, wherein
the third pattern section is provided with a plurality of fifth filter patterns and a plurality of sixth filter patterns; the plurality of fifth filter patterns and the plurality of sixth filter patterns are arranged into a plurality of filter pattern rows and a plurality of filter pattern columns; in each filter pattern row and each filter pattern columns, one sixth filter pattern is disposed between adjacent fifth filter patterns, and one fifth filter pattern is disposed between adjacent sixth filter patterns;
the light of the first wavelength can run through each fifth filter pattern but the light of the third wavelength cannot run through the fifth filter pattern; and the light of the second wavelength can run through each sixth filter pattern but the light of the third wavelength cannot run through the sixth filter pattern.

12. A patterning method employing the mask according to claim 1,
in the case where the light of the first wavelength and the light of the second wavelength can run through the non-pattern area of the mask, the method comprising:
sequentially forming a first film and first positive photoresist on the first film;
irradiating the first positive photoresist via the mask with the light of the second wavelength;
forming a first film pattern after first development and first etching;
sequentially forming a second film and second positive photoresist on the second film on the first film pattern;
irradiating the second positive photoresist via the mask with the light of the first wavelength; and
forming a second film pattern after second development and second etching; or
in the case where any of the light of the first wavelength and the light of the second wavelength cannot run through the non-pattern area of the mask, the method comprising:
sequentially forming a first film and first negative photoresist on the first film;
irradiating the first negative photoresist via the mask with the light of the first wavelength;
forming a first film pattern after first development and first etching;
sequentially forming a second film and second negative photoresist on the second film on the first film pattern;
irradiating the second negative photoresist via the mask with the light of the second wavelength; and
forming a second film pattern after second development and second etching.

13. The method according to claim 12, wherein
in the case where any of the light of the first wavelength and the light of the second wavelength cannot run through the non-pattern area of the mask, the pattern area of the mask is also provided with a third pattern section which is not overlapped with both the first pattern section and the second pattern section; light of third wavelength can run through the third pattern section but any of the light of the first wavelength and the light of the second wavelength cannot run through the third pattern section; the light of the third wavelength cannot run through the first pattern section, the second pattern section and the non-pattern area; and
the method further comprises:
sequentially forming a third film and third negative photoresist on the third film on the first film pattern and the second film pattern;
irradiating the third negative photoresist via the mask with the light of the third wavelength; and
forming a third film pattern after third development and third etching.

14. The method according to claim 13, wherein
the first film is made from an optical filter material of a first color;
the second film is made from an optical filter material of a second color;
the third film is made from an optical filter material of a third color; and
the first color, the second color and the third color are different from each other.

15. The method according to claim 12, wherein in the case where the light of the first wavelength and the light of the second wavelength can run through the non-pattern area of the mask, the pattern area of the mask is also provided with a third pattern section which is not overlapped with both the first pattern section and the second pattern section; the light of the first wavelength and the light of the second wavelength can run through the third pattern section but the light of the third wavelength cannot run through the third pattern section; the light of the third wavelength can run through the first pattern section, the second pattern section and the non-pattern area; and
the method further comprises:
sequentially forming a third film and third positive photoresist on the third film on the first film pattern and a second film pattern;

irradiating the third positive photoresist via the mask with the light of the third wavelength; and forming a third film pattern after third development and third etching.

16. A method for manufacturing a mask, comprising:

forming a pattern area on a base substrate, in which the pattern area is provided with a first pattern section and a second pattern section which are not overlapped with each other; light of a first wavelength can run through the first pattern section but light of a second wavelength cannot run through the first pattern section; the light of the second wavelength can run through the second pattern section but the light of the first wavelength cannot run through the second pattern section; and taking a portion of the base substrate, disposed on outside of an orthographic projection of the pattern area on the base substrate, as a non-pattern area, in which the light of the first wavelength and the light of the second wavelength can run through the non-pattern area; or forming the non-pattern area on a portion of the base substrate, disposed on outside of the orthographic projection of the pattern area on the base substrate, in which any of the light of the first wavelength and the light of the second wavelength cannot run through the non-pattern area;

wherein one of the first pattern section and the second pattern section includes a plurality of sub-patterns; the plurality of sub-patterns is arranged into a plurality of rows; each row of sub-patterns are sequentially arranged along first direction; the plurality of patterns are sequentially arranged along second direction;

the other of the first pattern section and the second pattern section includes a plurality of linear structures; each linear structure extends along the first direction; and the plurality of linear structures are sequentially arranged in parallel along the second direction.

17. The manufacturing method according to claim 16, wherein the pattern area is also provided with a third pattern section which is not overlapped with both the first pattern section and the second pattern section, in which in the case where any of the light of the first wavelength and the light of the second wavelength cannot run through the non-pattern area, light of third wavelength can run through the third pattern section but any of the light of the first wavelength and the light of the second wavelength cannot run through the third pattern section, and the light of the third wavelength cannot run through the first pattern section, the second pattern section and the non-pattern area; or in the case where the light of the first wavelength and the light of the second wavelength can run through the non-pattern area, the light of the first wavelength and the light of the second wavelength can run through the third pattern section but the light of the third wavelength cannot run through the third pattern section, and the light of the third wavelength can run through the first pattern section, the second pattern section and the non-pattern area.

18. The manufacturing method according to claim 16, wherein in the case where the portion of the base substrate, disposed on the outside of the orthographic projection of the pattern area on the base substrate, is taken as the non-pattern area, the base substrate is transparent; or in the case where the non-pattern area is formed on the portion of the base substrate, disposed on outside of the orthographic projection of the pattern area on the base substrate, the base substrate is transparent and an opaque material is formed on the portion of the base substrate.

* * * * *